(12) United States Patent
Yan et al.

(10) Patent No.: US 7,947,606 B2
(45) Date of Patent: May 24, 2011

(54) METHODS OF FORMING CONDUCTIVE FEATURES AND STRUCTURES THEREOF

(75) Inventors: Jiang Yan, Newburgh, NY (US); Roland Hampp, Poughkeepsie, NY (US); Jin-Ping Han, Fishkill, NY (US); Manfred Eller, Beacon, NY (US); Alois Gutmann, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 286 days.

(21) Appl. No.: 12/129,479

(22) Filed: May 29, 2008

(65) Prior Publication Data
US 2009/0294986 A1 Dec. 3, 2009

(51) Int. Cl.
*H01L 21/311* (2006.01)
(52) U.S. Cl. ........ 438/700; 438/689; 438/757; 438/570; 438/571; 438/574; 438/576; 438/579; 438/701; 438/702; 438/703
(58) Field of Classification Search .................. 438/689, 438/757, 570, 571, 574, 576, 578, 700–703
See application file for complete search history.

(56) References Cited

U.S. PATENT DOCUMENTS

| | | | |
|---|---|---|---|
| 5,662,768 | A | 9/1997 | Rostoker |
| 6,867,143 | B1 | 3/2005 | Furukawa et al. |
| 2006/0102959 | A1 * | 5/2006 | Kim et al. ............ 257/369 |
| 2009/0065817 | A1 * | 3/2009 | Cartier et al. ........ 257/288 |
| 2009/0127652 | A1 * | 5/2009 | Ding et al. ............ 257/508 |

FOREIGN PATENT DOCUMENTS

JP 61-237081 10/1986

* cited by examiner

*Primary Examiner* — N Drew Richards
*Assistant Examiner* — Jae Lee
(74) *Attorney, Agent, or Firm* — Slater & Matsil, L.L.P.

(57) ABSTRACT

Methods of forming features and structures thereof are disclosed. In one embodiment, a method of forming a feature includes forming a first material over a workpiece, forming a first pattern for a lower portion of the feature in the first material, and filling the first pattern with a sacrificial material. A second material is formed over the first material and the sacrificial material, and a second pattern for an upper portion of the feature is formed in the second material. The sacrificial material is removed. The first pattern and the second pattern are filled with a third material.

24 Claims, 8 Drawing Sheets

METHODS OF FORMING CONDUCTIVE FEATURES AND STRUCTURES THEREOF

TECHNICAL FIELD

The present invention relates generally to the fabrication of semiconductor devices, and more particularly to the fabrication of conductive features of transistor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

Contacts are conductive features that are used to make electrical contact to regions of transistors, such as source regions, drain regions, and gate regions of semiconductor devices. Contacts are often connected between the active regions of the transistors and conductive lines that couple the transistor to other parts of the semiconductor device or to contact pads, for example.

As features of semiconductor devices are decreased in size, as is the trend in the semiconductor industry, forming conductive features such as contacts becomes more challenging.

Thus, what are needed in the art are improved methods of forming conductive features of semiconductor devices and structures thereof.

SUMMARY OF THE INVENTION

These and other problems are generally solved or circumvented, and technical advantages are generally achieved, by preferred embodiments of the present invention, which provide novel methods of manufacturing semiconductor devices and transistors and structures thereof.

In accordance with one embodiment of the present invention, a method of forming a feature includes forming a first material over a workpiece, forming a first pattern for a lower portion of the feature in the first material, and filling the first pattern with a sacrificial material. A second material is formed over the first material and the sacrificial material, and a second pattern for an upper portion of the feature is formed in the second material. The sacrificial material is removed. The first pattern and the second pattern are filled with a third material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
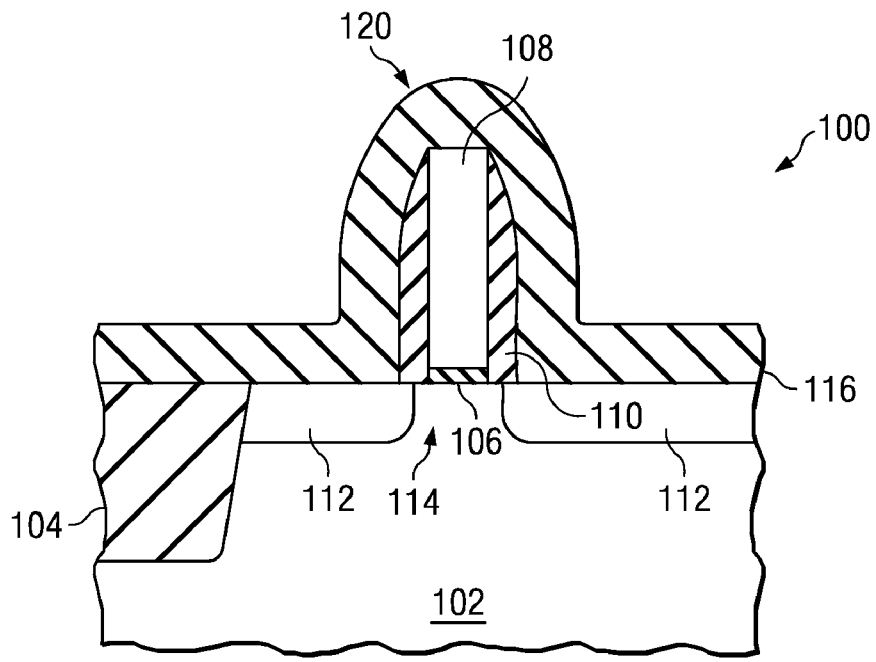
FIGS. 1 through 7 show cross-sectional views of a semiconductor device at various stages of manufacturing in accordance with an embodiment of the present invention, wherein contacts of a transistor are formed using a two step lithography process.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

There is a trend in semiconductor technology to reduce the size of devices, to improve performance and reduce power requirements, as examples. The minimum feature size or critical dimension (CD) of semiconductor devices continues to become smaller and smaller. For example, advanced technology nodes are developing 60 nm, 45 nm, and 32 nm CDs, and the trend in reducing CD's is expected to continue.

Some conductive features of semiconductor devices may comprise the minimum feature size or CD of a technology node, such as conductive area size and gate widths, which may comprise a minimum size on one side and extend lengthwise on another side, e.g., in a top view. Other types of conductive features may comprise the minimum feature size on both sides, such as contacts or vias.

Contacts typically are formed in a first metallization layer over a portion of a semiconductor device that is manufactured in a front end of the line (FEOL). Contacts may comprise a minimum feature size because some contacts may be used to make electrical contact with gates, which also comprise the minimum feature size, for example. Contacts can be difficult to manufacture, because they are often formed using a damascene process, wherein an insulating material is patterned and then filled with conductive material to fill the patterns. However, the insulating material may comprise a high aspect ratio, so that the patterns to be filled in the insulating material comprise a greater height than width, making them difficult to pattern and to fill with the conductive materials.

Thus, what are needed in the art are improved methods of forming contacts, conductive features, and other features of semiconductor devices.

Embodiments of the present invention achieve technical advantages by providing novel methods of forming features of semiconductor devices. The features may comprise conductive features, and may comprise contacts or vias in some applications, for example. Embodiments of the present invention comprise aspect ratio-friendly contact process flows for semiconductor devices.

The present invention will be described with respect to preferred embodiments in specific contexts, namely implemented in single transistor devices and CMOS two-transistor device applications. Embodiments of the invention may also be implemented in other semiconductor applications such as memory devices, logic devices, and other applications, for example. Embodiments of the invention may be used to form conductive features of other devices than transistors, and may also be used to form non-conductive features of semiconductor devices.

In accordance with an embodiment of the present invention, a method of forming a feature comprises forming a first material over a workpiece, patterning the first material with a first pattern for a lower portion of the feature, and filling the first pattern with a sacrificial material. A second material is formed over the first material and the sacrificial material, and the second material is patterned with a second pattern for an upper portion of the feature. The sacrificial material is removed, and the first and second patterns are filled with a third material. The feature may comprise a feature of a semiconductor device, for example.

FIGS. 1 through 7 show cross-sectional views of a semiconductor device 100 at various stages of manufacturing in accordance with a preferred embodiment of the present invention. To manufacture the semiconductor device 100, first, a workpiece 102 is provided. The workpiece 102 may include a semiconductor substrate, body, or workpiece comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Isolation regions 104 are formed in the workpiece 102. The isolation regions 104 may comprise shallow trench isolation (STI) regions, deep trench (DT) isolation regions, field oxide isolation regions, or other insulating regions, as examples. The isolation regions 104 may be formed by depositing a hard mask (not shown) over the workpiece 102 and forming trenches in the workpiece 102 and the hard mask using a lithography process. For example, the isolation regions 104 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple layers and combinations thereof, as examples. The hard mask may then be removed. Alternatively, the isolation regions 104 may be formed using other methods and may be filled with other materials.

A gate dielectric material 106 is deposited over the workpiece 102 and the isolation regions 104. The gate dielectric material 106 preferably comprises about 200 Angstroms or less of an oxide such as $SiO_2$, a nitride such as $Si_3N_4$, a high-k dielectric material having a dielectric constant greater than about 3.9, or combinations and multiple layers thereof, as examples. Alternatively, the gate dielectric material 106 may comprise other dimensions and materials, for example. The gate dielectric material 106 may be formed using thermal oxidation, chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

A gate material 108 is deposited over the gate dielectric material 106. The gate material 108 comprises an electrode material. The gate material 108 may comprise a thickness of about 1,500 Angstroms or less, for example. The gate material 108 may comprise a semiconductor material, such as polysilicon or amorphous silicon, a metal, and/or combinations or multiple layers thereof, as examples. Alternatively, the gate material 108 may comprise other dimensions and materials, for example. The gate material 108 may be formed by CVD, PVD, or other suitable deposition methods, for example. The gate material 108 may optionally be implanted with dopants; e.g., the gate material 108 may be predoped or may be doped later, at the same time source and drain regions 112 are implanted with dopants.

The gate material 108 and the gate dielectric material 106 are patterned using lithography to form a gate 108 and gate dielectric 106. For example, a layer of photosensitive material (not shown) such as a photoresist may be deposited over the gate material 108, and the layer of photosensitive material may be patterned with the desired pattern for the gate 108 and gate dielectric 106. An optional hard mask (also not shown) may be formed over the gate material 108 before depositing the layer of photosensitive material, for example. The hard mask may comprise a nitride material such as silicon nitride, an oxide material such as silicon dioxide, or multiple layers and combinations thereof, for example, although alternatively, the optional hard mask may comprise other materials. The patterned layer of photosensitive material and optionally also the hard mask are used as an etch mask to pattern the gate 108 and the gate dielectric 106. The layer of photosensitive material and the optional hard mask are then removed.

The gate 108 may comprise a width or a gate length of about 35 to 42 nm in some embodiments, for example, although alternatively, the gate 108 may comprise other dimensions. The gate 108 may comprise a minimum feature size of the technology node, e.g., of the manufacturing and lithography processes used to fabricate the semiconductor device 100. The gate 108 may extend lengthwise in and out of the paper in the view shown in FIG. 1 by about 500 nm, as an example. Alternatively, the gate 108 may comprise other dimensions depending on the particular application and the technology node used for the manufacturing of the semiconductor device 100, for example.

The workpiece 102 may be lightly doped with a dopant species to form lightly doped regions (not shown) in a top surface of the workpiece 102 proximate the gate 108 and gate dielectric 106, after the patterning of the optional hard mask, gate 108, and the gate dielectric 106. Other implantation processes (e.g., pocket implants, halo implants, or doublediffused regions) may optionally also be performed as desired after the patterning of the gate 108 and gate dielectric 106, for example.

A sidewall spacer material 110 is formed over the top surface of the gate 108, the workpiece 102, the isolation regions 104, and over the sidewalls of the gate 108 and gate dielectric 106, as shown in FIG. 1. The sidewall spacer material 110 may comprise one or more liners and may comprise two or more layers of insulating material, e.g., such as silicon nitride, silicon oxide, and/or silicon oxynitride, although other materials may also be used. The sidewall spacer material 110 may comprise an oxide liner and a nitride layer disposed over the oxide liner, as an example. The sidewall spacer material 110 may be substantially conformal as-deposited, for example. The sidewall spacer material 110 is etched using an anisotropic or directional etch process, leaving sidewall spacers 110 on the sidewalls of the gate 108 and gate dielectric 106, as shown in FIG. 1. The anisotropic etch process removes the sidewall spacer material 110 from the top surfaces of the gate 108, the workpiece 102, and the isolation regions 104, leaving sidewall spacers 110 on the sidewalls of the gate 108 and gate dielectric 106. The sidewall spacers 110 may comprise downwardly-sloping sidewalls, as shown, due to the anisotropic etch process, for example. The sidewall spacers 110 may comprise a thickness along the sidewalls of the gate 108 of about 100 to 400 Angstroms, although alternatively, the sidewall spacers 110 may comprise other dimensions.

After the formation of the sidewall spacers 110, the workpiece 102 may be implanted with a dopant species proximate the first sidewall spacers 110, forming source and drain regions 112 of a transistor 120. The workpiece 102 may be annealed or heated to drive the dopant species deeper into the workpiece 102, for example.

The sidewall spacers 110 may comprise temporary sidewall spacers that are later removed and replaced with permanent first sidewall spacers 110 that remain in the structure in some embodiments, for example. Alternatively, the sidewall spacers 110 may comprise permanent sidewall spacers, as another example. A channel region 114 of the transistor 120 is formed in the workpiece 102 beneath the gate 108, e.g., beneath the gate dielectric 106.

Only one transistor 120 and isolation region 104 is shown in FIG. 1. However, there may be a plurality of transistors 120 and isolation regions 104 formed across a surface of a workpiece 102, for example, not shown.

Portions of the transistor 120 comprise active areas, such as the gate 108 and the source and drain regions 112. The gate 108 and the source and drain region 112 may optionally be silicided, for example, not shown in FIG. 1 (see silicide 270a and 270b on source and drain regions 212a and 212b of FIG. 8).

Embodiments of the present invention comprise novel methods of forming features and structures thereof that are coupled to the transistor 120 active areas or the isolation region 104, to be described further herein. Embodiments of the present invention also include forming other types of devices over the workpiece 102, and forming features that are coupled to a portion of the devices, for example.

Figure 2:
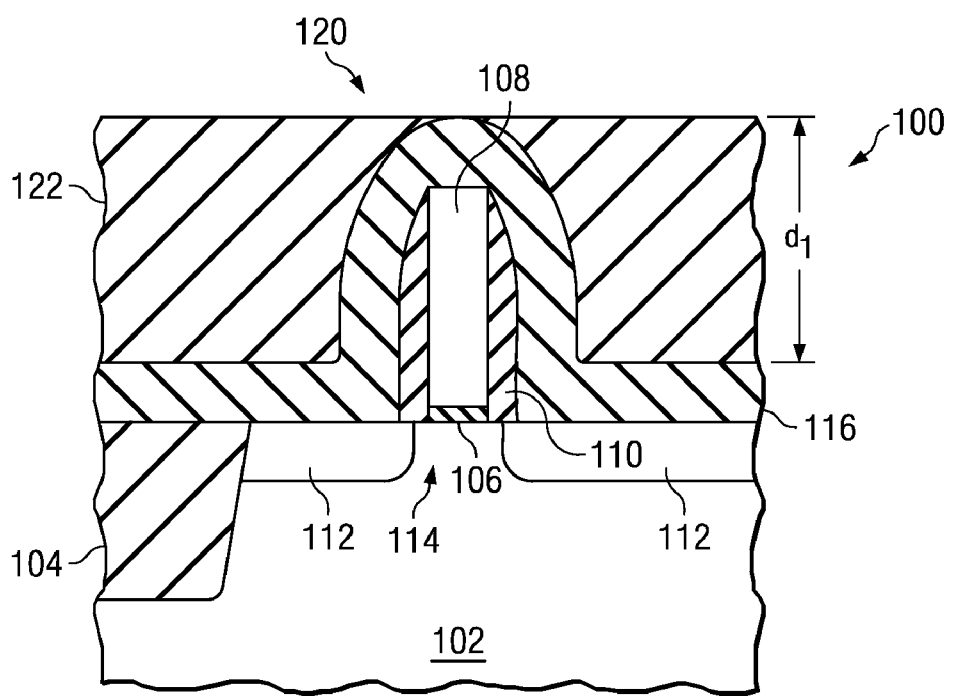
Figure 3:
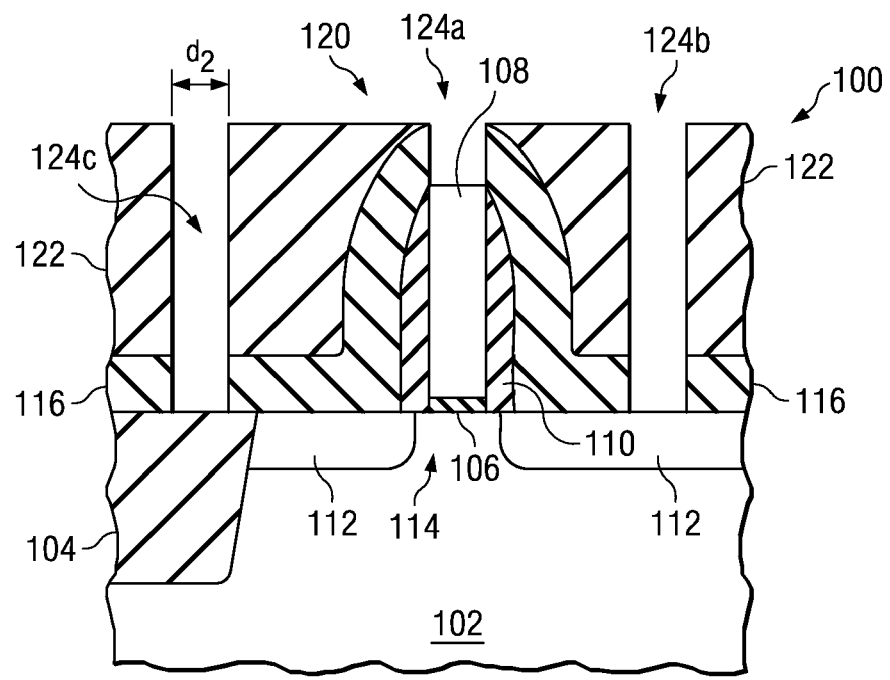
Figure 4:
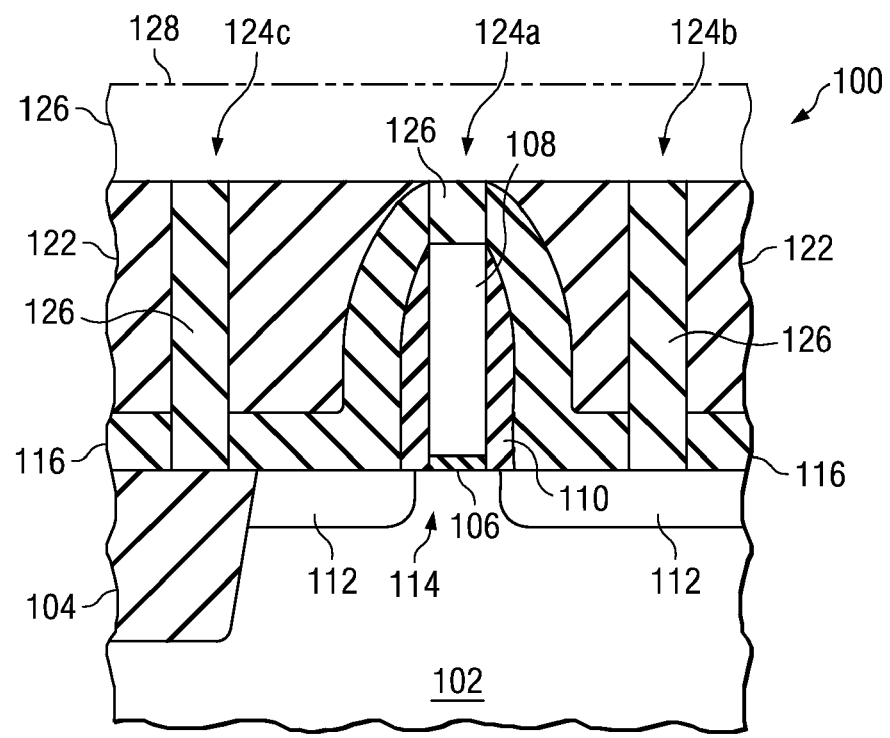
Figure 5:
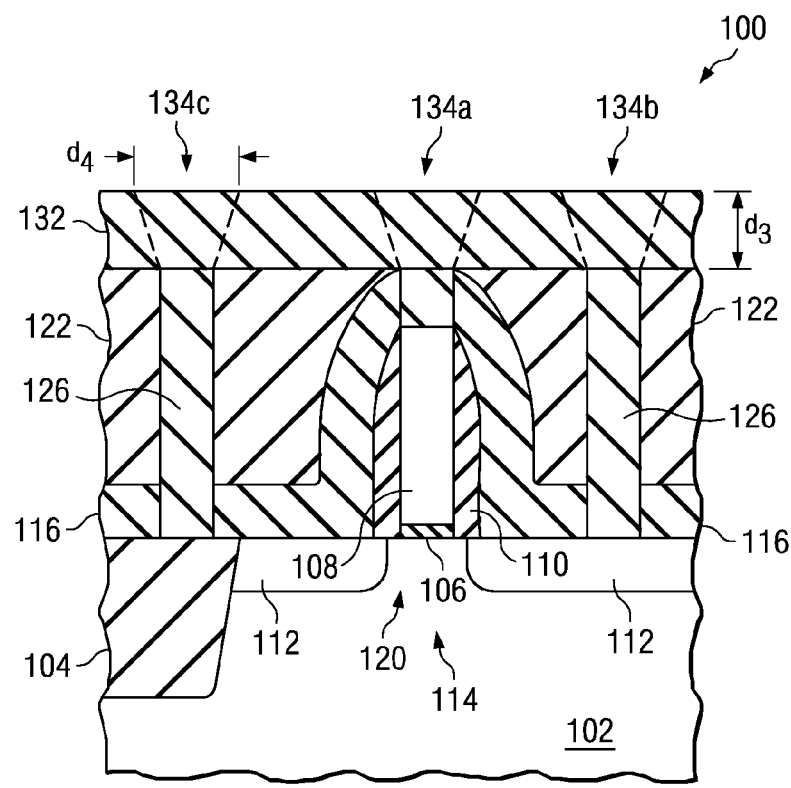
Figure 6:
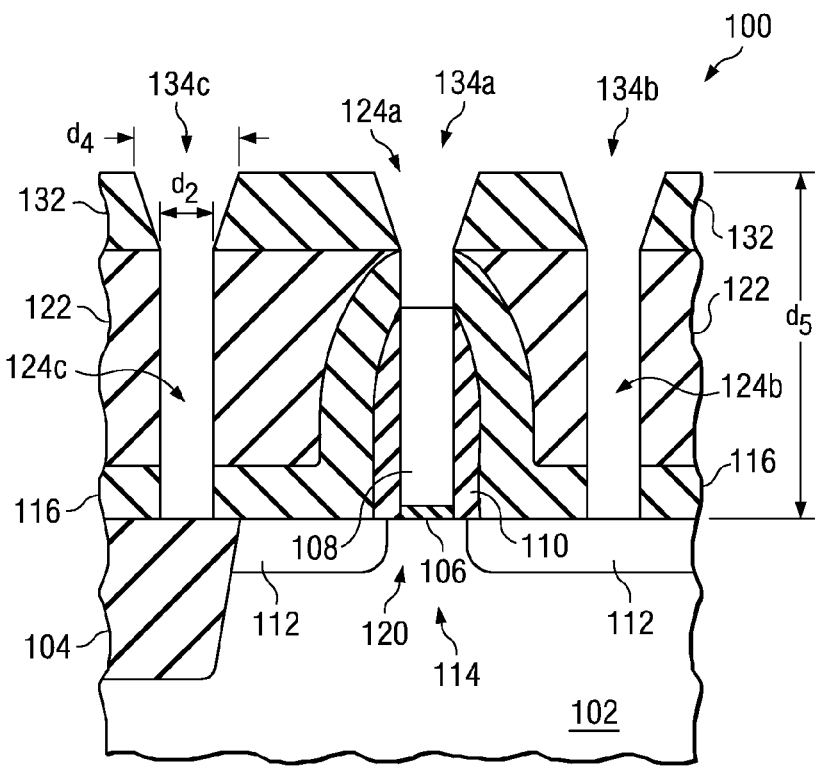
Figure 7:
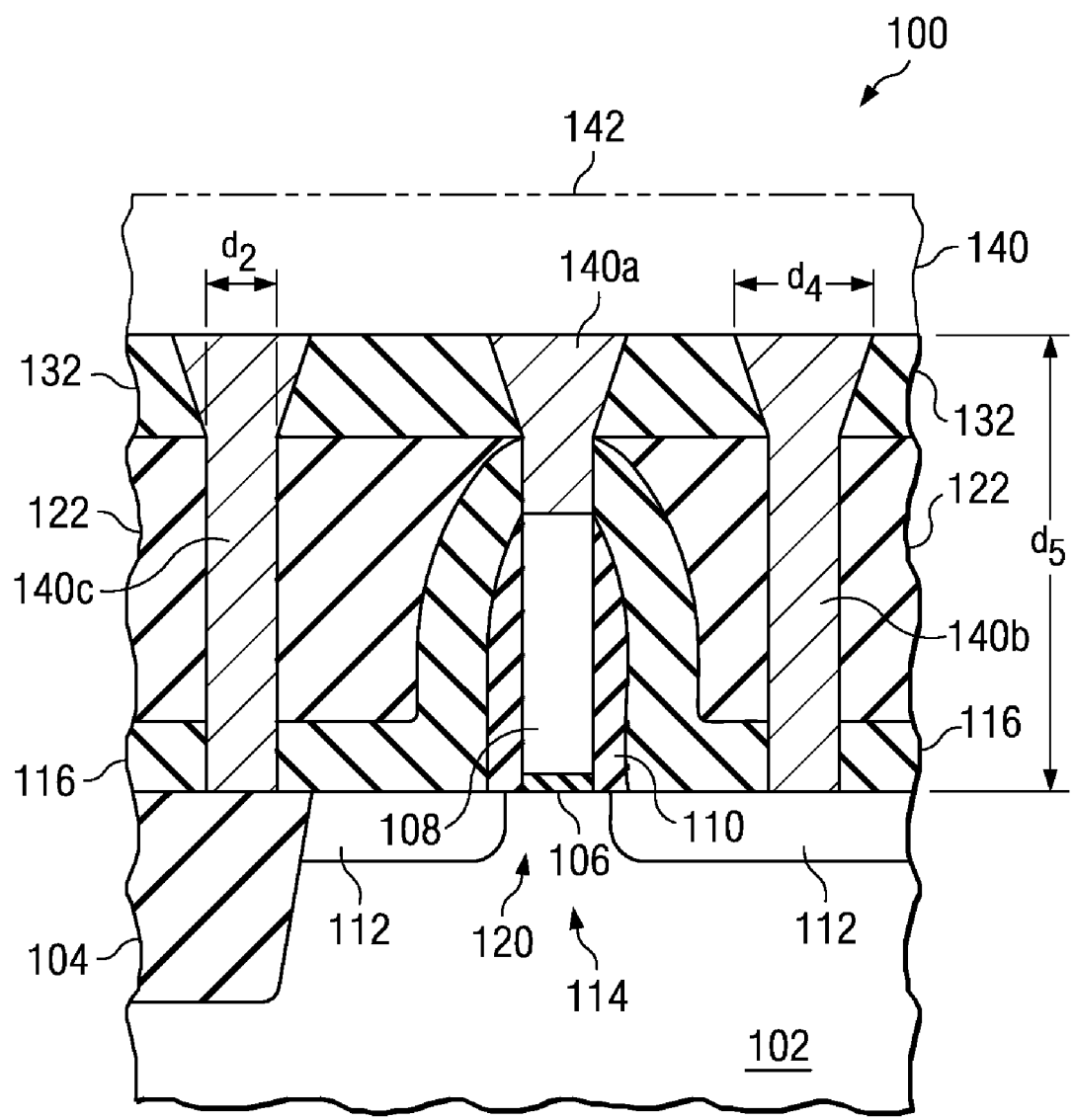

For example, in accordance with embodiments of the present invention, a first material 116/122 is deposited over the workpiece 102, as shown in FIGS. 1 and 2. The first material 116/122 is patterned with a first pattern 124a, 124b, and 124c for a lower portion of at least one feature 140a, 140b, and 140c (see FIG. 7), as shown in FIG. 3. A sacrificial material 126 is formed in the first pattern 124a, 124b, and 124c, as shown in FIG. 4. A second material 132 is formed over the first material 116/122 and the sacrificial material 126, as shown in FIG. 5, and the second material 132 is patterned with a second pattern 134a, 134b, and 134c for an upper portion of the at least one feature 140a, 140b, and 140c, as shown in FIG. 6. The sacrificial material 126 is removed. The first and second patterns 124a, 124b, 124c, 134a, 134b, and 134c are then filled with a third material 140, as shown in FIG. 7, forming at least one feature 140a, 140b, and 140c in the first material 116/122 and the second material 132. The features 140a, 140b, and 140c are coupled to the active areas of the transistor 120 and/or the isolation region 104, as shown.

In some embodiments, the first material 116/122 and the second material 132 comprise insulating materials, and the third material 140 comprises a conductive material or semi-conductive material, as shown in FIGS. 1 through 7 in a first embodiment and as shown in FIGS. 8 through 11 in a second embodiment. In other embodiments, the first material 116/122 and the second material 132 may comprise conductive materials or semiconductive materials, and the third material 140 may comprise an insulating material, for example. The third material 140 may comprise a different type of material than the first material 116/122 or the second material 132.

The first material 116/122 may include a stress-inducing material 116 and a first insulating material 122. The first insulating material 122 may comprise a partial insulating material layer for a contact level of the semiconductor device 100, and the second insulating material 132 may comprise a remaining insulating material layer for the contact level of the semiconductor device 100, for example. Thus, the first insulating material 122 and the second insulating material 132 may together comprise an insulating material layer for a contact layer.

To fabricate the semiconductor device 100, the first material 116/122 is formed over the workpiece 102, e.g., over the top surface of the workpiece 102, the isolation region 104, and the transistor 120, as shown in FIGS. 1 and 2. The first material 116/122 may comprise a single material layer in some embodiments, not shown. In other embodiments, the first material 116/122 may comprise a stress-inducing material 116 and a first insulating material 122 disposed over the stress-inducing material 116, as shown in FIG. 2.

The stress-inducing material 116 may comprise a material adapted to induce a stress on the transistor 120, e.g., on the channel region 114. The stress-inducing material 116 may comprise a nitride material such as silicon nitride, although alternatively, other materials may be used for the stress-inducing material 116. The stress-inducing material 116 may comprise a thickness of about 100 nm or less, for example, although alternatively, the stress-inducing material 116 may comprise other dimensions. The stress-inducing material 116 may be adapted to cause a compressive or tensile stress, depending on the type of transistor 120, for example. The stress-inducing material 116 may be substantially conformal as deposited, for example.

The type of material, the deposition process, and the thickness of the stress-inducing material 116 may be selected to achieve the amount and type of stress required to improve the performance of the transistor 120, for example. The various types and amount of stress may be created in a nitride material such as silicon nitride by changing the deposition temperature and various processing conditions, for example.

If the transistor 120 comprises a p channel metal oxide semiconductor (PMOS) field effect transistor (FET), the stress-inducing material 116 may comprise a material that increases the tensile stress of the source region and the drain regions 112 of the transistor 120, which creates compressive stress on the channel region 114, for example. As another example, if the transistor 120 comprises an n channel metal oxide semiconductor (NMOS) field effect transistor (FET), the stress-inducing material 116 may comprise a material adapted to increase the compressive stress of the source and drain region 112 of the transistor 120, which creates tensile stress on the channel region 114, for example.

Alternatively, the stress-inducing material 116 may not be included in the structure in some embodiments, not shown. The first material 116/122 may only comprise a first insulating material 122, for example.

A first insulating material 122 is deposited or formed over the stress-inducing material 116, as shown in FIG. 2, or over the workpiece 102, the isolation regions 104, and the transistor 120, if the stress-inducing material 116 is not included. The first insulating material 112 may comprise silicon dioxide, silicon nitride, a low dielectric constant (k) material having a dielectric constant of less than about 3.9, other insulating materials, or combinations or multiple layers thereof, for example. The thickness or dimension $d_1$ of the first insulating material 122 may comprise several hundred nm, for example, although alternatively, dimension $d_1$ may comprise other values. The thickness or dimension $d_1$ of the first insulating material 122 may comprise about 200 nm in some embodiments, for example, and may comprise about 100 nm or greater in some applications. The first insulating material 122 may be deposited to cover the top surface of the gate 108 or the stress-inducing material 116 disposed over the gate 108, for example.

The first insulating material 122 may be deposited having a top surface that is disposed above or over the top surface of the stress-inducing material 116. A chemical mechanical polish (CMP) process and/or an etch process may be used to lower the height of the first insulating material 122, leaving the structure shown in FIG. 2. The CMP process may be adapted to stop on the stress-inducing material 116 over the gate 108, for example.

The top surface of the stress-inducing material 116 over the gate 108 may comprise substantially the same height as the top surface of the first insulating material 122, as shown. The top surface of the stress-inducing material 116 over the gate 108 and the top surface of the first insulating material 122 may be coplanar, so that a smooth top surface resides over the workpiece 102, for example.

Next, using a first lithography process, the first material 116/122 is patterned with a first pattern 124a, 124b, and 124c for a lower portion of at least one feature 140a, 140b, and 140c (see FIG. 7), as shown in FIG. 3. The first material 116/122 is patterned by depositing a photosensitive material over the first material 116/122, patterning the photosensitive material using a lithography mask or direct etch process, developing the photosensitive material, and using the photosensitive material as an etch mask while exposed portions of the first material 116/122 are etched away, leaving the patterns 124a, 124b, and 124c in the first material 116/122, as shown in FIG. 3.

The first pattern comprises a plurality of patterns 124a, 124b, and 124c. Only three patterns 124a, 124b, and 124c are shown in FIG. 3; alternatively, the first pattern for the lower portion of the features may comprise many patterns 124a, 124b, and 124c formed across the surface of the workpiece 102.

The patterns 124a, 124b, and 124c comprise a first pattern for a lower portion of at least one conductive feature, such as a contact or via. The patterns 124a, 124b, and 124c may comprise a width comprising dimension $d_2$, wherein dimension $d_2$ is about 100 nm or less, although alternatively, dimension $d_2$ may comprise other dimensions. Dimension $d_2$ may comprise a minimum feature size of the lithography system and process used to form the patterns 124a, 124b, and 124c, in some embodiments, for example. Alternatively, dimension $d_2$ may be larger than a minimum feature size, as another example. The width or dimension $d_2$ of the first patterns 124a, 124b, and 124c in the first material 116/122 is also referred to herein as a first width.

The patterns 124a, 124b, and 124c may comprise a square or rectangular shape in a top view, for example, not shown. The patterns 124a, 124b, and 124c may alternatively be round or elliptical in a top view, also not shown. Alternatively, the patterns 124a, 124b, and 124c may comprise other shapes.

Pattern 124a shown in FIG. 3 comprises a pattern for a lower portion of a conductive feature or contact that is coupled to the gate 108 of the transistor 120. Pattern 124b comprises a pattern for a lower portion of a contact that is coupled to the source or drain region 112 of the transistor 120. Pattern 124c comprises a pattern for a lower portion of a contact that is coupled to the isolation region 104 proximate the transistor 120.

The etch process to form the patterns 124a, 124b, and 124c may comprise a wet or dry etch process, or combinations thereof, for example. The etch process may alternatively comprise a reactive ion etch (RIE) process, as another example.

Next, in accordance with embodiments of the present invention, the patterns 124a, 124b, and 124c in the first material 116/122 are filled with a sacrificial material 126, as shown in FIG. 4. The sacrificial material 126 may comprise a top surface that extends over a top surface of the first insulating material 122 of the first material 116/122, for example, as shown at 128 in phantom. The workpiece 102 may be exposed to a CMP and/or an etch process to remove the excess sacrificial material 126 from over the top surface of the first insulating material 122, as shown.

The sacrificial material 126 comprises an insulating material in some embodiments. The sacrificial material 126 may comprise carbon or germanium oxide ($GEO_2$), as examples. The sacrificial material 126 may comprise other types of materials that are easily removed in a subsequent processing step from the patterns 124a, 124b, and 124c in some embodiments, for example. The sacrificial material 126 may be deposited using CVD or other deposition processes, for example. The top surface of the sacrificial material 126 and the first insulating material 122 may be coplanar, as shown.

A second material 132 is then formed over the first material 116/122 and the sacrificial material 126, as shown in FIG. 5. The second material 132 comprises a second insulating material in some embodiments, for example. The second material 132 may alternatively comprise other materials, such as a conductive material or semiconductive material in other embodiments. The second material 132 may comprise a similar material or materials as described for the first insulating material 122, for example. The second material 132 may comprise the same material as the first insulating material 122, or the second material 132 may comprise a different material than the first insulating material 122, for example.

The second material 132 may comprise a thickness or dimension $d_3$ of about 100 nm or greater, as an example, although alternatively, the dimension $d_3$ may comprise other values. The second material 132 may comprise a thickness or dimension $d_3$ that is less than the thickness or dimension $d_1$ of the first insulating material 122, for example, as shown in FIG. 5. Alternatively, the second material 132 may comprise a greater thickness or dimension $d_3$ than the thickness or dimension $d_1$ of the first insulating material 122, or the second material 132 may comprise a thickness or dimension $d_3$ that is substantially the same as the thickness or dimension $d_1$ of the first insulating material 122, as examples, not shown.

The second material 132 is patterned using a second lithography process, forming a second pattern 134a, 134b, and 134c in the second material 132 for an upper portion of features, as shown in phantom in FIG. 5. The second patterns 134a, 134b, and 134c may comprise a width comprising dimension $d_4$ that may be larger than the width or dimension $d_2$ of the first patterns 124a, 124b, and 124c, as shown, in some embodiments. The second patterns 134a, 134b, and 134c being larger than the first patterns 124a, 124b, and 124c ensures alignment of the second patterns 134a, 134b, and 134c with the underlying first patterns 124a, 124b, and 124c, for example. Dimension $d_4$ may comprise about twice a minimum feature size of the lithography system and process used to process the semiconductor device 100 in some embodiments, for example. Alternatively, dimension $d_4$ may comprise other values. The width or dimension $d_4$ of the second patterns 134a, 134b, and 134c in the second material 132 is also referred to herein as a second width, wherein the second width or dimension $d_4$ is greater than the first width or dimension $d_2$ of the first patterns 124a, 124b, and 124c in the first material 116/122.

The etch process used to form the second patterns 132a, 134b, and 134c may result in second patterns 132a, 134b, and 134c comprising tapered sidewalls, wherein the second patterns 132a, 134b, and 134c are larger at the top than at the bottom within the second insulating material 132. The etch process used to form the first patterns 124a, 124b, and 124c may also comprise tapered sidewalls, being larger at the top of the first material 116/122 than at the bottom of the first material 116/122, not shown. However, in some embodiments, the etch process used to form the first patterns 124a, 124b, and 124c in the first material 116/112 may comprise more of an isotropic component than the etch process used to form the second patterns 132a, 134b, and 134c in the second material 132, resulting in first patterns 124a, 124b, and 124c having substantially vertical sidewalls, as shown.

At least portions of the second patterns 134a, 134b, and 134c in the second material 132 may be larger than the first patterns 124a, 124b, and 124c in the first material 116/122. For example, the second patterns 134a, 134b, and 134c may comprise substantially the first width or dimension $d_2$ in the bottom portion of the second material 132, and the second patterns 134a, 134b, and 134c may comprise substantially the second width or dimension $d_4$ in a top portion of the second material 132, as shown in phantom in FIG. 5.

A different lithography mask may be used to pattern the second insulating material 132 than the lithography mask used to pattern the first insulating material 122 and the stress-inducing material 116, for example.

The second patterns 134a, 134b, and 134c being larger than the first patterns 124a, 124b, and 124c is advantageous in some embodiments because the fill process or deposition process for the third material 140 (see FIG. 7) is facilitated, for example. The second patterns 134a, 134b, and 134c may be about 20 to 40% larger than the first patterns 124a, 124b, and 124c in some embodiments, for example. In other embodiments, the second patterns 134a, 134b, and 134c may be about 50% or less larger than the first patterns 124a, 124b, and 124c, as another example. Larger second patterns 134a, 134b, and 134c also facilitates in the removal of the sacrificial material 126 from within the first patterns 124a, 124b, and 124c in the first material 116/122, for example.

After the second material 132 is patterned to form the second patterns 134a, 134b, and 134c over the first patterns 124a, 124b, and 124c in the first material 116/122, the sacrificial material 126 is removed from the first patterns 124a, 124b, and 124c in the first material 116/122, as shown in FIG. 6. The sacrificial material 126 may be removed using an etch process, an ashing process, a cleaning process, or a removal process comprising deionized water. Alternatively, the sacrificial material 126 may be removed using other methods.

For example, in embodiments wherein the sacrificial material 126 comprises $GeO_2$, the sacrificial material 126 may be removed using a cleaning process comprising deionized water. In embodiments wherein the sacrificial material 126 comprises carbon, the sacrificial material 126 may be removed using an ashing process, wherein the workpiece 102 is heated and the ashed carbon is then cleaned from the workpiece 102. The method of removing the sacrificial material 126 may be selected according to the type of material used for the sacrificial material 126. In accordance with some embodiments, for example, the material choice of the sacrificial material 126 is selected to that the sacrificial material 126 is easy to remove.

The first patterns 124a, 124b, and 124c in the first material 116/122 and the second patterns 134a, 134b, and 134c in the second material 132 are then filled with a third material 140, as shown in FIG. 7. The third material 140 comprises a conductive material in some embodiments, e.g., if the first material 116/122 and the second material 132 comprise insulating materials. The third material 140 may alternatively comprise a semiconductive material. Alternatively, the third material 104 may comprise an insulator, e.g., if the first material 116/122 and the second material 132 comprise conductive or semiconductive materials. The third material 140 comprises a different type of material than the first material 116/122 and the second material 132, in some embodiments.

The third material 140 may comprise a conductive material such as W, Cu, Al, TiN, Ti, TaN, other metals, or multiple layers, liners, or combinations thereof in some embodiments, for example, although alternatively, the third material 140 may comprise other materials. The third material 140 may be formed using CVD, PVD, a sputter process, or other methods, as examples, although other methods may also be used to form the third material 140. The third material 140 may be deposited having a top surface that extends over the top surface of the second material 132, as shown at 142 in phantom. A CMP process and/or etch process may be used to remove the excess third material 140 from over the top surface of the second material 132, leaving features 140a, 140b, and 140c formed in the first material 116/122 and the second material 132, as shown in FIG. 7. The third material 140 may be planarized, for example.

The features 140a, 140b, and 140c comprise a height comprising dimension $d_5$ within the first insulating material 122, the second insulating material 132, and the stress-inducing material 116, if present. Dimension $d_5$ may comprise several hundred nm or less, for example, although alternatively, dimension $d_5$ may comprise other values.

The features 140a, 140b, and 140c comprise conductive features in some embodiments, wherein the conductive features comprise contacts or vias that are coupled to portions of the transistor 120. For example, feature 140a is coupled to the gate 108 of the transistor 120, and feature 140b is coupled to the source or drain region 112 of the transistor 120. Some features 140a, 140b, and 140c may also be coupled to other devices or regions of the workpiece 102. For example, feature 140c is coupled to the isolation region 104 proximate the transistor 120.

Conductive lines, not shown, may be formed over the features 140a, 140b, and 140c in subsequently formed conductive line or metallization layers, not shown. The conductive lines and the features 140*a*, 140*b*, and 140*c* connect the active areas of the transistor 120 to other regions of the semiconductor device 100 or to contact pads on a upper material layer of the semiconductor device 100, which may be connected to for use in an end application, e.g., during packaging of the semiconductor device 100, for example.

Thus, embodiments of the present invention provide novel methods of forming features 140*a*, 140*b*, and 140*c* of semiconductor device 100, wherein a two-step lithography process is used to form the patterns 124*a*, 124*b*, 124*c*, 134*a*, 134*b*, and 134*c* for the features 140*a*, 140*b*, and 140*c* in the first material 116/122 and the second material 132. The sacrificial material 126 fills the first patterns 124*a*, 124*b*, and 124*c* in the first material 116/122 during the formation of the second patterns 134*a*, 134*b*, and 134*c* in the second material 132. Advantageously, because the second patterns 134*a*, 134*b*, and 134*c* are larger than the first patterns 124*a*, 124*b*, and 124*c* in some embodiments, the fill process for the third material 140 is improved, avoiding the formation of voids within the patterns 124*a*, 124*b*, 124*c*, 134*a*, 134*b*, and 134*c*. Furthermore, the larger second patterns 134*a*, 134*b*, and 134*c* improve the alignment with the first patterns 124*a*, 124*b*, and 124*c*.

Embodiments of the present invention may also be implemented in semiconductor devices comprising multiple transistors. Embodiments of the present invention may be implemented in a CMOS device, on either the PMOS FET or the NMOS FET, or both, of a CMOS device. FIGS. 8 through 11 illustrate cross-sectional views of an embodiment of the present invention implemented in both an NMOS FET 254 and a PMOS FET 258 of a CMOS device 250. Like numerals are used for the various elements that were described in FIGS. 1 through 7. To avoid repetition, each reference number shown in FIGS. 8 through 11 is not described again in detail herein. Rather, similar materials x02, x04, x06, x08, etc. . . . are preferably used to describe the various material layers shown as were used to describe FIGS. 1 through 7, where x=1 in FIGS. 1 through 7 and x=2 in FIGS. 8 through 11. As an example, the materials and dimensions described for the stress-inducing materials 116 in the description for FIGS. 1 through 7 may also be used for the stress-inducing materials 216*a* and 216*b* shown in FIGS. 8 through 11.

Figure 8:
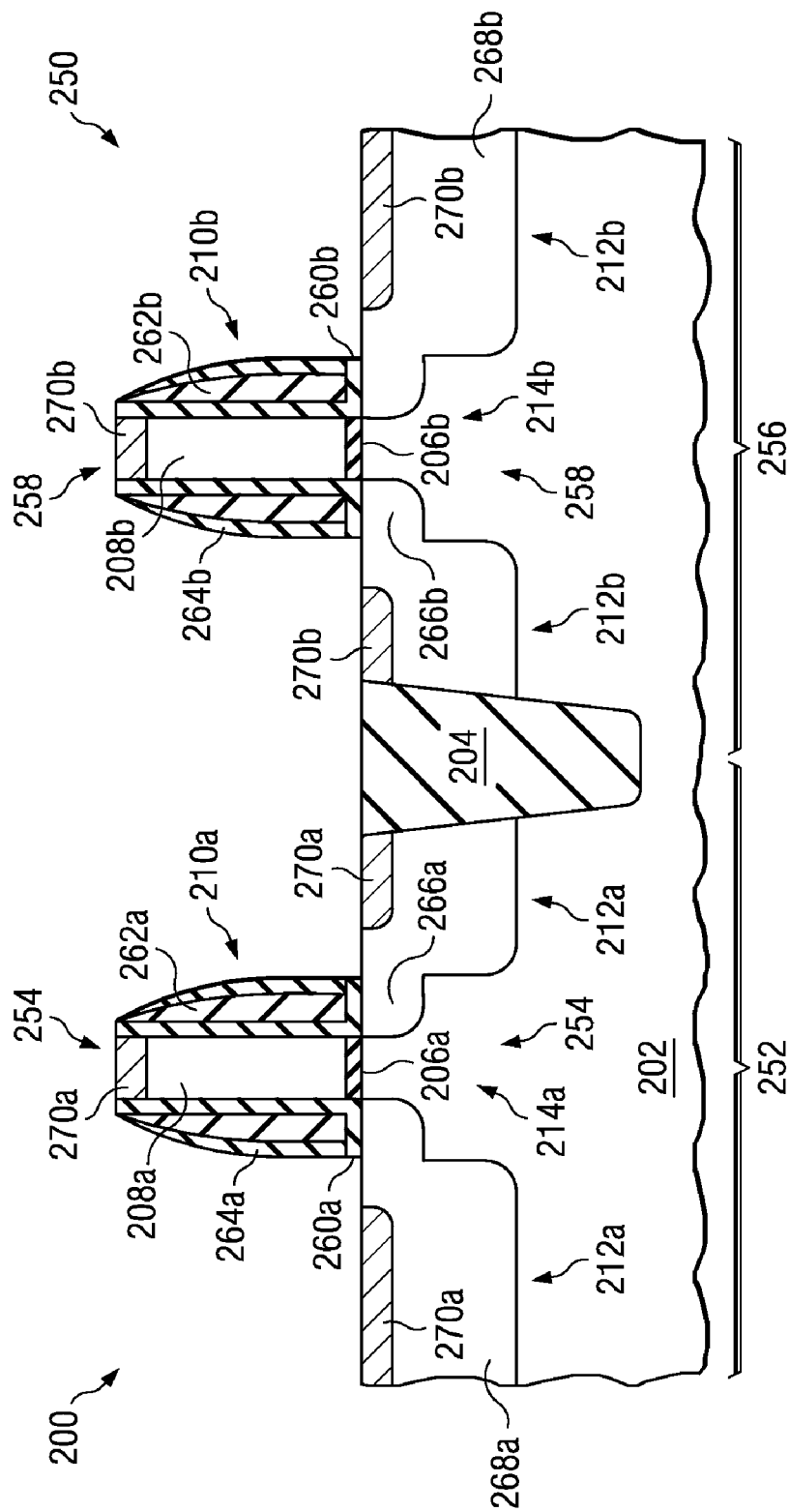
FIGS. 8 through 11 show cross-sectional views of a semiconductor device in accordance with another embodiment of the present invention, wherein contacts of an n channel metal oxide semiconductor (NMOS) field effect transistor (FET) and a p channel metal oxide semiconductor (PMOS) FET of a complementary metal oxide semiconductor (CMOS) device are formed using the two step lithography process.

Referring next to FIG. 8, the semiconductor device 200 includes a workpiece 202 comprising a first region 252 wherein the NFET 254 is formed and a second region 256 wherein the PFET 258 is formed. A plurality of NFETs 254 and PFETs 258 may be formed across the surface of the workpiece 202, for example, not shown, in the first region 252 and the second region 256, or in a plurality of first regions 252 and second regions 256. The NFET 254 may comprise a first transistor and the PFET 258 may comprise a second transistor. The first transistor 254 may alternatively comprise a PFET, and the second transistor 258 may alternatively comprise an NFET, for example.

Sidewall spacers 210*a* and 210*b* of the transistors 254 and 258 may comprise a first oxide liner 260*a* and 260*b* and a nitride material 262*a* and 262*b* disposed over the oxide liners 260*a* and 260*b*. A second oxide liner 264*a* and 264*b* may be disposed over the nitride material 262*a* and 262*b* of the sidewall spacers 210*a* and 210*b*, for example.

The source and drain regions 212*a* and 212*b* may comprise shallow implantation regions 266*a* and 266*b* proximate the gates 208*a* and 208*b* and deeper implantation regions 268*a* and 268*b* proximate the sidewall spacers 210*a* and 210*b*, as shown.

A silicide 270*a* and 270*b* may be formed over the top surfaces of portions of the source and drain regions 212*a* and 212*b* and over the gates 208*a* and 208*b*. The silicide 270*a* and 270*b* may be formed by depositing a silicidation metal over the source and drain regions 212*a* and 212*b*, e.g., over all exposed surfaces of the structure, and then subjecting the workpiece 202 to an annealing process. Any remaining silicidation metal after the anneal process may then be removed.

Figure 9:
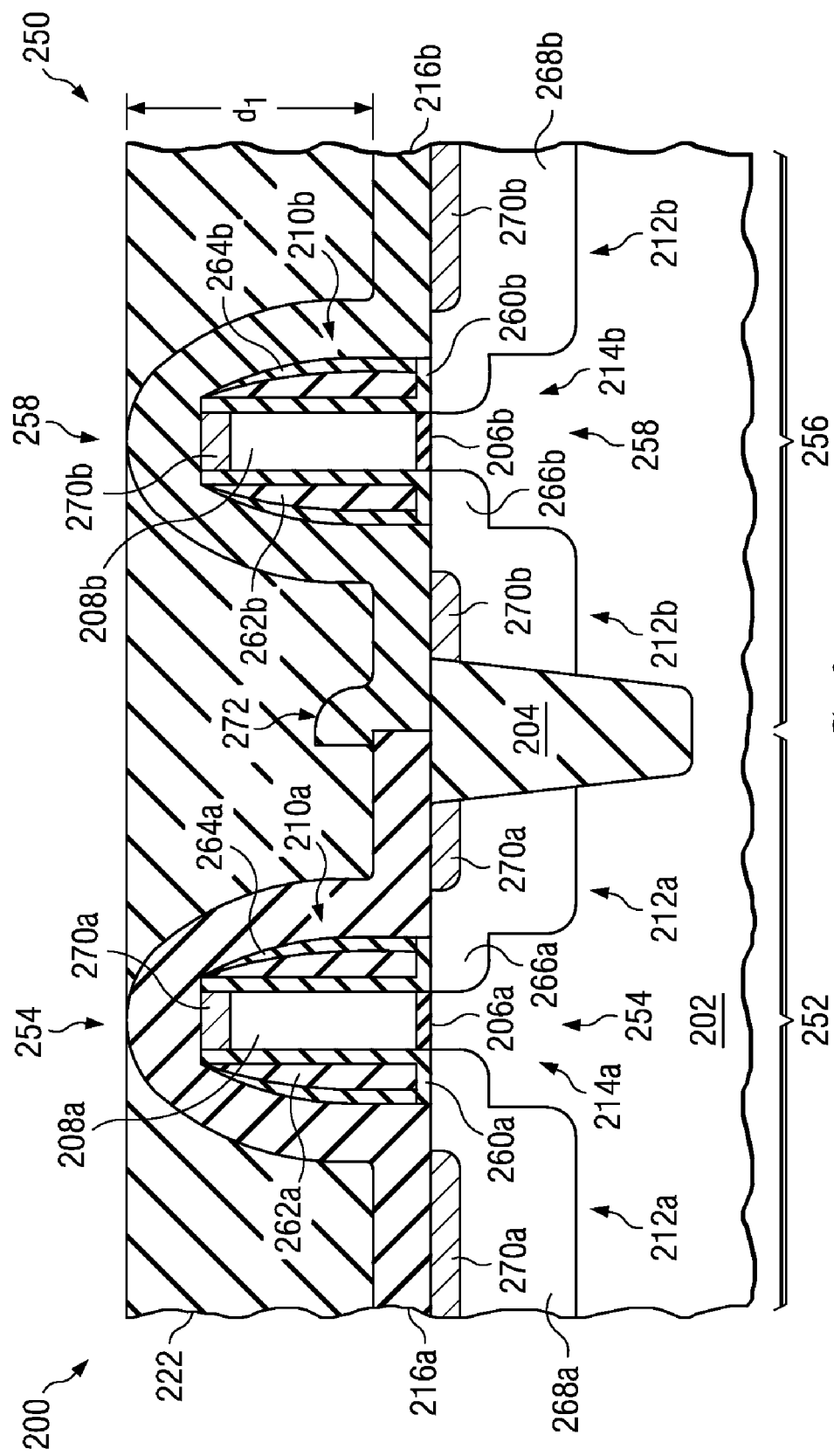

A first stress-inducing material 216*a* is disposed or formed over the first transistor 254 in the first region 252, and a second stress-inducing material 216*b* is disposed over the first transistor 254 in the second region 256, as shown in FIG. 9. The second stress-inducing material 216*b* may be different than the first stress-inducing material 216*a* and may introduce a different amount or type of stress than the first stress-inducing material 216*a*, for example. The second stress-inducing material 216*b* may overlap the first stress-inducing material 216*a* in a third region 272 between the first region 252 and the second region 256, for example.

If the first transistor 254 comprises an NFET, the first stress-inducing material 216*a* may comprise a nitride liner adapted to induce a tensile stress on the channel region 214*a*, for example. If the second transistor 258 comprises a PFET, the second stress-inducing material 216*b* may comprise a nitride liner adapted to induce a compressive stress on the channel region 214*b*, for example. Alternatively, the first and second stress-inducing materials 216*a* and 216*b* may introduce other types of stress and may comprise other materials.

Figure 10:
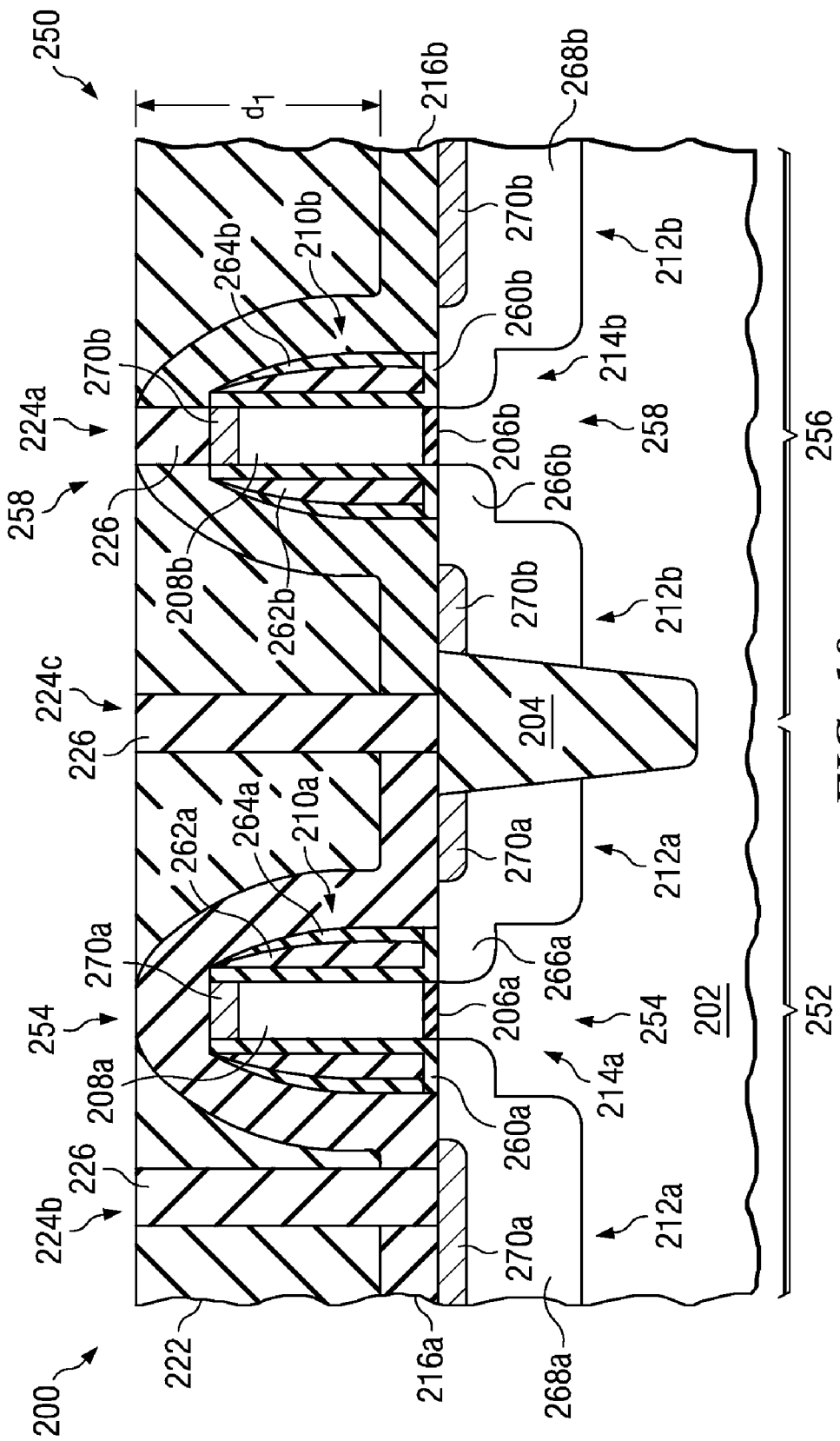

The first insulating material 222 is formed over the first stress-inducing material 216*a* and the second stress-inducing material 216*b*, also shown in FIG. 9. The first insulating material 222, the first stress-inducing material 216*a*, and the second stress-inducing material 216*b* are patterned with a first pattern for a lower portion of at least one conductive feature in at least the first region 252 and the second region 256. The first pattern in the first insulating material 222, the first stress-inducing material 216*a*, and the second stress-inducing material 216*b* is filled with a sacrificial material 226, as shown in FIG. 10.

Figure 11:
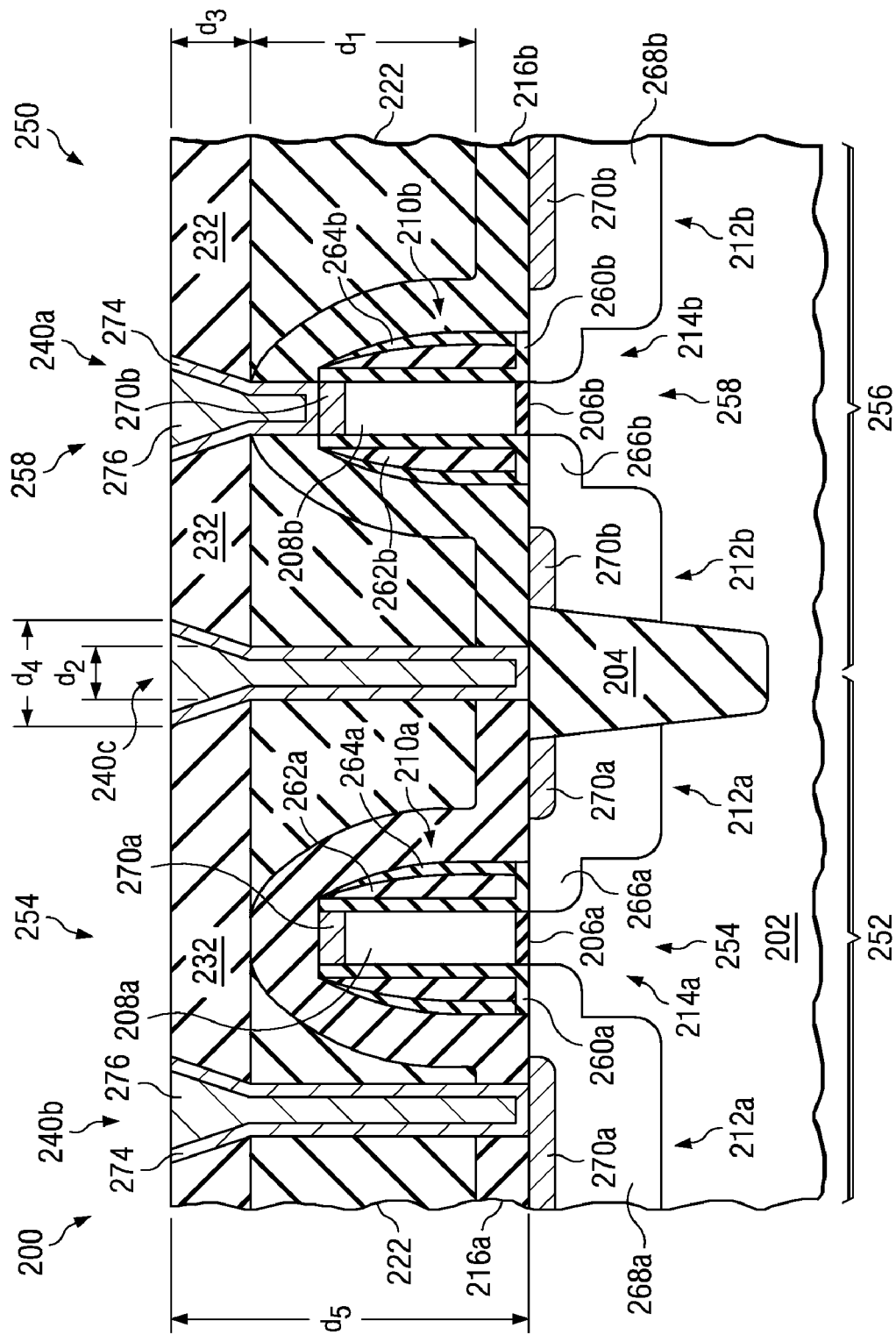

A second insulating material 232 is formed over the first insulating material 222 and the sacrificial material 226. The second insulating material 232 is patterned with a second pattern a pattern for an upper portion of the at least one conductive feature in at least the first region 252 and the second region 256. At least a portion of the second pattern is disposed over the first pattern in the first insulating material 222 and the first and second stress-inducing materials 216*a* and 216*b*. The sacrificial material 226 is removed from within the first insulating material 222, the first stress-inducing material 216*a*, and the second stress-inducing material 216*b*. The first pattern in the first insulating material 222, the first stress-inducing material 216*a*, and the second stress-inducing material 216*b* and the second pattern in the second insulating material 232 are filled a conductive material 240, forming conductive features 240*a*, 240*b*, and 240*c*, as shown in FIG. 11.

The conductive features 240*a*, 240*b*, and 240*c* may comprise a conductive liner 274 and a conductive fill material 276 formed over the liner 274, for example. The conductive liner 274 may comprise TaN, Ti, or TiN, and the conductive fill material 276 may comprise W in some embodiments, for example. Materials 274 and 276 may alternatively comprise other materials.

Conductive feature 240*a* is coupled to the gate 208*b* of the second transistor 258. Conductive feature 240*b* is coupled to a source or drain regions 212*a* of the first transistor 254. Conductive feature 240*c* is coupled to the isolation region 204. A plurality of conductive features 240*a*, 240*b*, and 240*c* may be formed across a surface of the workpiece 202, for example, not shown. Each of the conductive features 240a, 240b, and 240c represents a different type or species of contact for the semiconductor device 200, for example.

In some embodiments, patterning the first insulating material 222, the first stress-inducing material 216a, and the second stress-inducing material 216b with the first pattern for the lower portion of the at least one conductive feature 240a, 240b, and 240c in at least the first region 252 and the second region 256 may further comprise removing the second stress-inducing material 216b and the first stress-inducing material 216a in the third region. This may be advantageous in some applications wherein leaving the second stress-inducing material 216b over the first stress-inducing material 216a may have deleterious effects on the stress of the semiconductor device 200, for example.

The manufacturing process for the semiconductor device 200 is then continued to complete the fabrication of the device 200. Metallization layers (not shown) may be formed over the second insulating material 232 to interconnect the various components of the semiconductor device 200. The semiconductor device 200 may be annealed to activate the dopants implanted during the various implantation steps, for example, e.g., such as implantation regions 266a, 266b, 268a, and 268b of the source and drain regions 212a and 212b.

Embodiments of the present invention may be implemented in applications where transistors are used, as described herein and shown in the figures. One example of a memory device that embodiments of the present invention may be implemented in that uses both PMOS FET's and NMOS FET's is a static random access memory (SRAM) device. A typical SRAM device includes arrays of thousands of SRAM cells, for example. Each SRAM cell may have four or six transistors, for example, although other numbers of transistors may also be used. A commonly used SRAM cell is a six-transistor (6T) SRAM cell, which has two PMOS FET's interconnected with four NMOS FET's, as one example. The novel methods of forming source and drain regions and structures thereof described herein may be implemented in the manufacturing process of SRAM devices and other memory devices, for example.

Embodiments of the present invention include methods of forming features and methods of fabricating the semiconductor devices 100 and 200 described herein, for example. Embodiments of the present invention also include semiconductor devices 100 and 200 manufactured using the methods described herein.

Advantages of embodiments of the present invention include providing novel structures and methods for forming features 140a, 140b, 140c, 240a, 240b, and 240c of semiconductor devices 100 and 200. Novel methods of forming contact and via holes are provided, for example. Two lithography processes are used to form the conductive features 140a, 140b, 140c, 240a, 240b, and 240c described herein, wherein the first material 116/122 and 216a/216b/222 and the second material 132 and 232 patterned using the lithography processes and manufacturing processes described herein comprise significantly reduced aspect ratios.

Embodiments of the present invention are easily implementable in existing manufacturing process flows, with a small or reduced number of additional processing steps being required, for example. Embodiments of the present invention are particularly beneficial in technology nodes having very small minimum feature sizes, such as about 45 nm and below, for example.

Shorts that may form proximate gates 108, 208a, and 208b in some applications may be avoided using embodiments of the present invention, because of the reduced aspect ratio of the partial material layers 122 and 132, and 222 and 232, and the lithography processes used to pattern the conductive features 140a, 140b, 140c, 240a, 240b, and 240c.

The patterns for the conductive features 140a, 140b, 140c, 240a, 240b, and 240c are easier to fill, resulting in improved device 100 and 200 yields. Because the first material 116/122 and 216a/216b/222 and the second material 132 and 232 are patterned in two lithography steps, controlling the CD and profile of the conductive features 140a, 140b, 140c, 240a, 240b, and 240c is facilitated.

The methods described herein result in reduced diversity in contact hole types or species, e.g., between gate contacts, source and drain contacts, and isolation region contacts. A process window for forming the conductive features 140a, 140b, 140c, 240a, 240b, and 240c is increased by embodiments of the present invention, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a feature, the method comprising:
   forming a first material over a workpiece;
   forming a device over the workpiece before forming the first material over the workpiece;
   forming a first pattern for a lower portion of the feature in the first material;
   filling the first pattern with a sacrificial material;
   forming a second material over the first material and the sacrificial material;
   forming a second pattern for an upper portion of the feature in the second material;
   removing the sacrificial material; and
   filling the first pattern and the second pattern with a third material, wherein the feature comprises a feature of a semiconductor device, wherein the feature of the semiconductor device is coupled to a portion of the device.

2. The method according to claim 1, wherein forming the first material and forming the second material comprise forming an insulating material, and wherein filling the first pattern and the second pattern with the third material comprises forming a conductive or a semiconductive material.

3. The method according to claim 1, wherein forming the first material and forming the second material comprise forming a conductive or a semiconductive material, and wherein filling the first pattern and the second pattern with the third material comprises forming an insulating material.

4. The method according to claim 1, wherein filling the first pattern and the second pattern with the third material comprises forming a different type of material than the first material or the second material.

5. The method according to claim 1, wherein filling the first pattern with the sacrificial material comprises filling the first pattern with $GeO_2$ or carbon.

6. The method according to claim 1, wherein removing the sacrificial material comprises an etch process, an ashing process, a cleaning process, or a removal process comprising deionized water.

7. A method of forming a conductive feature, the method comprising:
   forming a first insulating material over a workpiece;
   forming at least one transistor within and/or over the workpiece before forming the first insulating material over the workpiece;
   patterning the first insulating material with a first pattern for a lower portion of the conductive feature;
   filling the first pattern in the first insulating material with a sacrificial material;
   forming a second insulating material over the first insulating material and the sacrificial material;
   patterning the second insulating material with a second pattern for an upper portion of the conductive feature;
   removing the sacrificial material from within the first insulating material; and
   filling the first pattern in the first insulating material and the second pattern in the second insulating material with a conductive material, wherein the conductive feature comprises a conductive feature of a semiconductor device, and wherein filling the first pattern in the first insulating material and the second pattern in the second insulating material comprises forming a conductive feature that is coupled to, a region proximate and/or a portion of, the at least one transistor.

8. The method according to claim 7, wherein the conductive feature is coupled to a portion of the at least one transistor.

9. The method according to claim 8, wherein forming the at least one transistor over the workpiece comprises forming at least one transistor comprising a source region, a drain region, or a gate, wherein forming the conductive feature that is coupled to the portion of the at least one transistor comprises forming a conductive feature that is coupled to the source region, the drain region, or the gate of the at least one transistor.

10. The method according to claim 7, wherein the conductive feature is coupled to an isolation region proximate the at least one transistor.

11. The method according to claim 7, wherein filling the first pattern in the first insulating material and the second pattern in the second insulating material with the conductive material comprises forming a conductive material wherein a top surface of the conductive material is disposed over a top surface of the second insulating material, further comprising planarizing or etching the conductive material, removing the conductive material from over the top surface of the second insulating material.

12. The method according to claim 7, wherein filling the first pattern in the first insulating material and the second pattern in the second insulating material with the conductive material comprises filling the first pattern in the first insulating material and the second pattern in the second insulating material with a conductive material comprising W, Cu, Al, TiN, Ti, TaN, or multiple layers, liners, or a combination thereof.

13. A method of fabricating a semiconductor device, the method comprising:
   providing a workpiece having a first region and a second region;
   forming at least one first transistor in the first region of the workpiece and forming at least one second transistor in the second region of the workpiece;
   forming a first stress-inducing material over the at least one first transistor in the first region and forming a second stress-inducing material over the at least one second transistor in the second region;
   forming a first insulating material over the first stress-inducing material in the first region and over the second stress-inducing material in the second region;
   patterning the first insulating material, the first stress-inducing material, and the second stress-inducing material with a first pattern for a lower portion of at least one conductive feature in at least the first region and the second region;
   filling the first pattern in the first insulating material, the first stress-inducing material, and the second stress-inducing material with a sacrificial material;
   forming a second insulating material over the first insulating material and the sacrificial material;
   patterning the second insulating material with a second pattern a pattern for an upper portion of the at least one conductive feature in at least the first region and the second region, at least a portion of the second pattern being disposed over the first pattern;
   removing the sacrificial material from within the first insulating material, the first stress-inducing material, and the second stress-inducing material; and
   filling the first pattern in the first insulating material, the first stress-inducing material, and the second stress-inducing material and filling the second pattern in the second insulating material with a conductive material, forming at least one conductive feature in the first region and the second region, the at least one conductive feature being coupled to or proximate the at least one first transistor and the at least one second transistor.

14. The method according to claim 13, wherein the second stress-inducing material overlaps the first stress-inducing material in a third region between the first region and the second region, wherein patterning the first insulating material, the first stress-inducing material, and the second stress-inducing material with the first pattern for the lower portion of the at least one conductive feature in at least the first region and the second region further comprises removing the second stress-inducing material and the first stress-inducing material in the third region.

15. The method according to claim 13, wherein patterning the second insulating material with the second pattern for the upper portion of the at least one conductive feature in the first region and the second region comprises forming a larger pattern than the first pattern.

16. The method according to claim 15, wherein patterning the second insulating material with the second pattern for the upper portion of the at least one conductive feature in the first region and the second region comprises forming a second pattern that is about 50% or less larger than the first pattern.

17. The method according to claim 13, wherein forming the at least one first transistor and forming the at least one second transistor comprise forming gates over the workpiece and forming source regions and drain regions proximate the gates, further comprising forming a plurality of isolation regions in the workpiece in the first region and the second region of the workpiece.

18. The method according to claim 17, wherein forming the at least one conductive feature in the first region and the second region comprises forming at least one conductive feature that is coupled to the gate, the source region, or the drain region of the at least one first transistor or the at least one second transistor, or wherein forming the at least one conductive feature in the first region and the second region comprises forming at least one conductive feature that is coupled to one of the plurality of isolation regions.

19. The method according to claim 18, further comprising forming a silicide over the gates, source regions, or drain regions, before forming the first stress-inducing material over the at least one first transistor in the first region and forming the second stress-inducing material over the at least one second transistor in the second region.

20. The method according to claim 18, wherein forming the at least one first transistor in the first region of the workpiece and forming at least one second transistor in the second region of the workpiece comprise forming an n channel metal oxide semiconductor (NMOS) field effect transistor (FET) and a p channel metal oxide semiconductor (PMOS) FET of a complementary metal oxide semiconductor (CMOS) device.

21. A method of fabricating a semiconductor device, the method comprising:
provoiding a workpiece that includes a conductive region;
forming a first insulating material over the workpiece;
forming a first opening for a first portion of a conductive feature within the first insulating material;
after forming the first opening, forming a second insulating material over the first insulating material; and
forming a second opening for a second portion of the conductive feature in the the second insulating material; and
filling the first opening and the second opening to form the conductive feature, wherein the conductive feature is electrically coupled to the conductive region, wherein the first portion of the conductive feature comprises a first width in the first insulating material, and wherein the second portion of the conductive feature comprises a second width in at least a portion of the second insulating material, the second width being greater than the first width.

22. The method according to claim 21, wherein the conductive feature comprises substantially the first width in a bottom portion of the second insulating material, and wherein the conductive feature comprises substantially the second width in a top portion of the second insulating material.

23. The method according to claim 21, wherein the first insulating material comprises a stress-inducing material and an insulating material disposed over the stress-inducing material.

24. A method of forming a conductive feature, the method comprising:
forming a first insulating material over a workpiece;
forming a stress-inducing material over the workpiece before forming the first insulating material over the workpiece;
patterning the first insulating material with a first pattern for a lower portion of the conductive feature, wherein patterning the first insulating material comprises forming the first pattern in the stress-inducing material;
filling the first pattern in the first insulating material with a sacrificial material, wherein filling the first pattern comprises filling the first pattern in the stress-inducing material with the sacrificial material;
forming a second insulating material over the first insulating material and the sacrificial material;
patterning the second insulating material with a second pattern for an upper portion of the conductive feature;
removing the sacrificial material from within the first insulating material, wherein removing the sacrificial material from within the first insulating material further comprises removing the sacrificial material from within the stress-inducing material; and
filling the first pattern in the first insulating material and the second pattern in the second insulating material with a conductive material, wherein filling the first pattern in the first insulating material and the second pattern in the second insulating material comprises filling the first pattern in the stress-inducing material with the conductive material, wherein the conductive feature comprises a conductive feature of a semiconductor device, and wherein the conductive feature includes the conductive material in the first pattern of the stress-inducing material.

* * * * *